US009590557B2

(12) United States Patent
Quinlan et al.

(10) Patent No.: US 9,590,557 B2
(45) Date of Patent: *Mar. 7, 2017

(54) PHOTOVOLTAIC-CLAD MASONRY UNIT

(71) Applicant: SolaBlock LLC, Hadley, MA (US)

(72) Inventors: Patrick John Adrian Quinlan, Hadley, MA (US); Jonathan Richard Lewis, Amherst, MA (US); Jason Michael Laverty, Westfield, MA (US)

(73) Assignee: SolaBlock LLC, Easthampton, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/737,796

(22) Filed: Jun. 12, 2015

(65) Prior Publication Data

US 2015/0280640 A1    Oct. 1, 2015

Related U.S. Application Data

(63) Continuation of application No. 14/157,831, filed on Jan. 17, 2014, now Pat. No. 9,059,348.

(51) Int. Cl.
*H01L 31/042* (2014.01)
*H02S 20/26* (2014.01)
*H01L 31/05* (2014.01)
*H01L 31/048* (2014.01)

(52) U.S. Cl.
CPC ............ *H02S 20/26* (2014.12); *H01L 31/048* (2013.01); *H01L 31/05* (2013.01); *Y02B 10/10* (2013.01); *Y02E 10/50* (2013.01)

(58) Field of Classification Search
CPC ............ H01L 31/0483; H01L 31/0484; H01L 31/0231; H01L 31/0422; H01L 31/05; Y02E 10/50; Y02E 10/10; H02S 20/26
See application file for complete search history.

(56) References Cited

U.S. PATENT DOCUMENTS

| | | | |
|---|---|---|---|
| 4,487,989 A | 12/1984 | Wakefield et al. | |
| 4,823,241 A * | 4/1989 | Trattner | F21L 4/08 |
| | | | 136/291 |
| 5,573,600 A | 11/1996 | Hoang | |
| 5,768,831 A | 6/1998 | Melchior | |
| 2001/0023704 A1 | 9/2001 | Boe | |
| 2005/0109384 A1 | 5/2005 | Shingleton et al. | |

(Continued)

FOREIGN PATENT DOCUMENTS

JP          2013-110281          6/2013

OTHER PUBLICATIONS

International Search Report and Written Opinion, PCT/US2015/011759, mailed Apr. 23, 2015, 11 pages.

(Continued)

*Primary Examiner* — Tamir Ayad
*Assistant Examiner* — Uyen Tran
(74) *Attorney, Agent, or Firm* — Fish & Richardson P.C.

(57) ABSTRACT

A masonry unit including a photovoltaic cell for generation of electricity is described herein. More particularly a photovoltaic-clad concrete block that combines the structural attributes of concrete block (or other masonry unit) and the energy production of solar photovoltaics is described herein. Methods for manufacturing, installing, and electrically connecting such photovoltaic-clad concrete blocks are also described herein.

14 Claims, 10 Drawing Sheets

(56) References Cited

U.S. PATENT DOCUMENTS

| | | |
|---|---|---|
| 2007/0277810 A1 | 12/2007 | Stock |
| 2008/0289272 A1 | 11/2008 | Flaherty et al. |
| 2008/0302030 A1* | 12/2008 | Stancel ............. H01L 31/02008 52/173.3 |
| 2010/0126094 A1 | 5/2010 | Loomis et al. |
| 2013/0133721 A1* | 5/2013 | Balyon .................. H02S 20/23 136/251 |

OTHER PUBLICATIONS

Notification Concerning Transmittal of International Preliminary Report on Patentability (Chapter I of the Patent Cooperation Treaty) for International Appl. No. PCT/US2015/011759, mailed on Jul. 28, 2016, 8 pages.

* cited by examiner

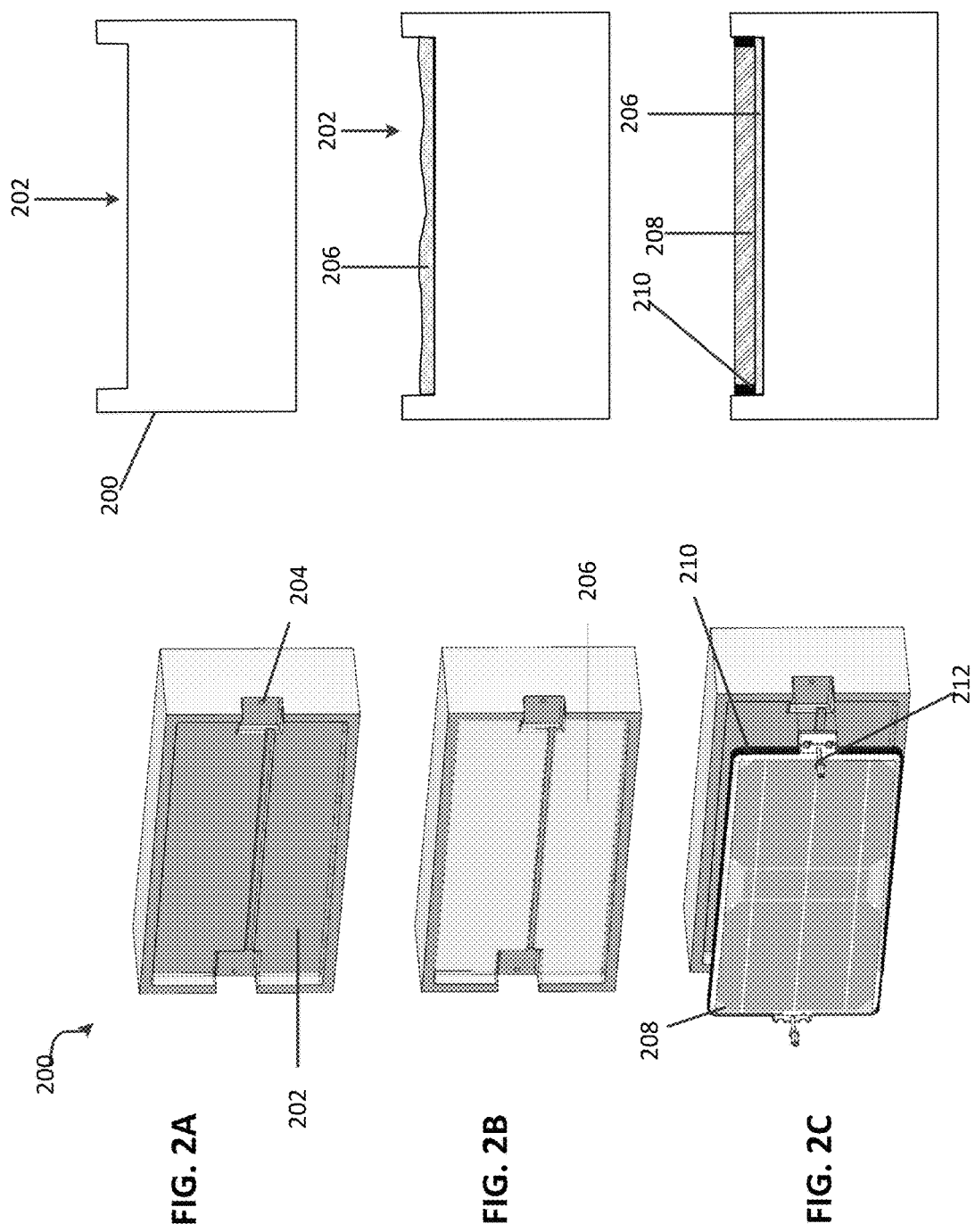

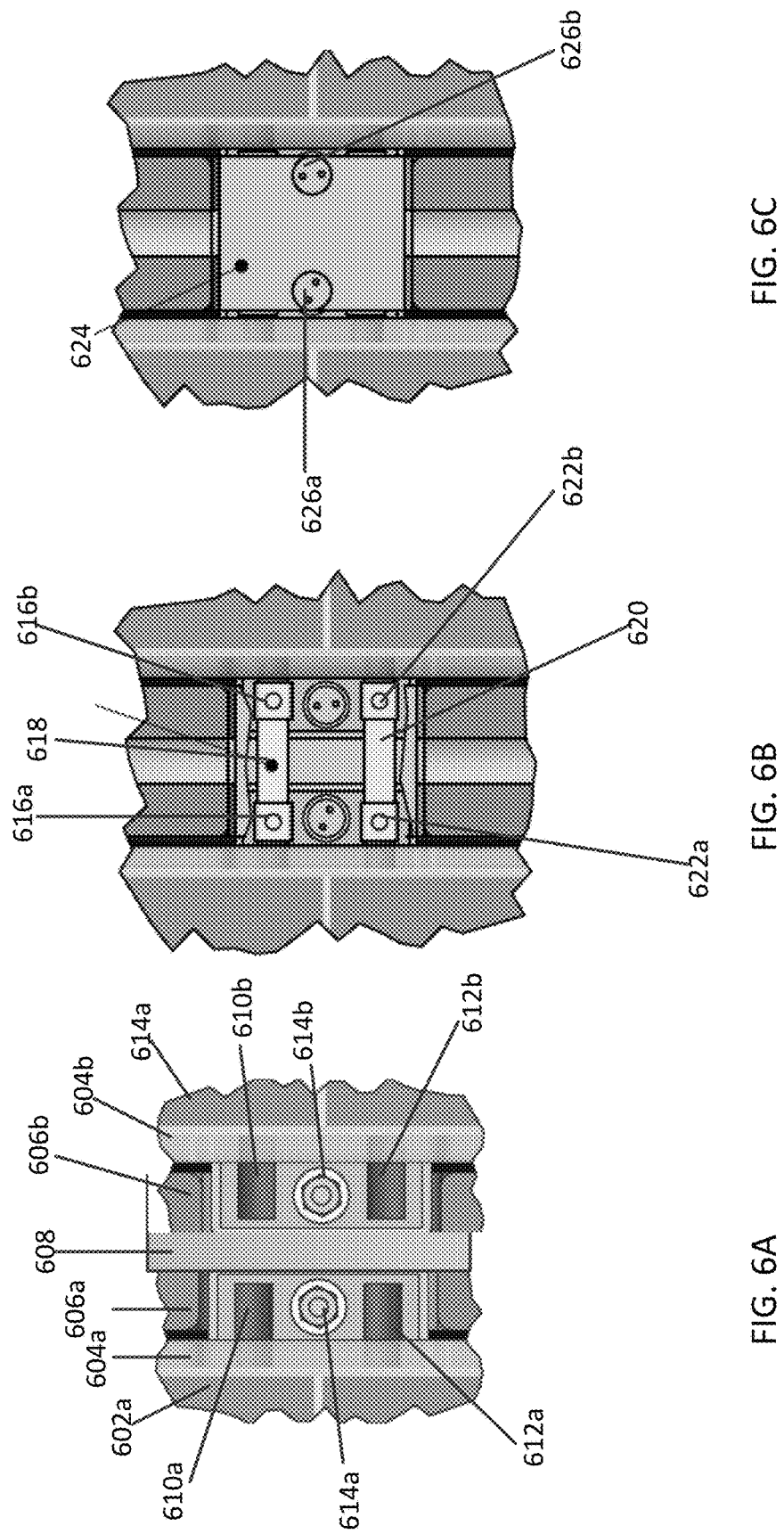

PHOTOVOLTAIC-CLAD MASONRY UNIT

CLAIM OF PRIORITY

This application is a continuation of and claims priority under 35 U.S.C. §120 to U.S. patent application Ser. No. 14/157,831, filed on Jul. 17, 2014, the entire contents of which is hereby incorporated by reference.

FIELD

A masonry unit including one or more solar cells for generation of electricity is described herein. More particularly a photovoltaic-clad masonry unit that combines the structural attributes of a concrete block (or other masonry unit) with the energy production of solar photovoltaics is described herein. Methods for manufacturing, installing, and electrically connecting such photovoltaic-clad masonry units are also described herein.

BACKGROUND

Since electricity is an expensive utility, one step towards conservation is to design buildings that reduce demand of electricity purchased from the power grid. One way to reduce the amount of energy required to be purchased to power the building is to supplement or replace reliance on energy purchased from the power grid by using renewable sources of energy such as solar energy to power the building and devices within the building.

One example of using solar energy is the use of photovoltaic arrays on the outer surfaces of buildings and structures, such as the roofs and outer walls of the building or structure. Such photovoltaic arrays can be attached to the building and interconnected after the building is built, thus allowing a building to be retrofitted to use renewable energy. In general, a photovoltaic cell or photocell is an electrical device that converts the energy of light directly into electricity by the photovoltaic effect.

SUMMARY

A masonry unit including one-or-more photovoltaic cells (e.g., a solar cells) for generation of electricity is described herein. More particularly, a photovoltaic-clad masonry unit that combines the structural attributes of concrete block (or other masonry unit) with the energy production of solar photovoltaics is described herein. Methods for manufacturing, installing, and electrically connecting such photovoltaic-clad masonry units (e.g., photovoltaic-clad concrete blocks) are also described herein.

In some examples, the photovoltaic-clad masonry units described herein can be used to "solarize" residential or commercial building walls, cavity walls, retaining walls, rights-of-way, garden walls, sound walls or any wall or portion of a facade receiving sunlight for a portion of the day. In some additional examples, the photovoltaic-clad masonry unit can be used to harvest renewable energy from highway sound-walls, bridges, parking structures, railroad rights-of-way, property walls, or any other conventionally-walled location and/or provide solar power to unattended buildings, signs, or off-grid buildings. Additionally, the photovoltaic-clad masonry unit can be advantageously used to provide power to critical buildings or shelters that may lose grid-power and/or have a likelihood of damage to conventional roof-mounted solar cells in extreme conditions such as in hurricane-force winds.

In some aspects, a photovoltaic-clad masonry unit includes a photovoltaic unit and a masonry block. The photovoltaic unit includes a rigid support structure, one or more photovoltaic cells supported by the rigid support structure, and a cover disposed above the one or more photovoltaic cells and configured to be secured to the rigid support structure to provide a water resistant enclosure that encloses the one or more photovoltaic cells, a positive terminal extending from the photovoltaic unit and electrically connected to the one or more photovoltaic cells, and a negative terminal extending from the photovoltaic unit and electrically connected to the one or more photovoltaic cells. The masonry block includes a depression on the outward facing side of the block, the photovoltaic unit being secured within the depression.

Embodiments can include one or more of the following.

The photovoltaic-clad masonry unit is configured such that connections between adjacent photovoltaic-clad masonry units are provided on an outward facing side of the photovoltaic-clad masonry units.

The masonry block can include a first depression extending to the edge of the masonry block that is configured to provide a first connection region with the positive terminal extending into the first connection region and a second depression extending to the edge of the masonry block that is configured to provide a second connection region with the negative terminal extending into the second connection region.

The photovoltaic-clad masonry can also include an adhesive layer disposed in the depression between a surface of the masonry block and the photovoltaic unit, the adhesive layer being configured to secure the photovoltaic unit within the depression.

The one or more photovoltaic cells can include a first photovoltaic cell having a shape that is substantially square with angled corners, a second photovoltaic cell having a shape that is substantially square with angled corners, and a third photovoltaic cell having a shape that is substantially rectangular, the third photovoltaic cell arranged between the first and second photovoltaic cells and having a height that is substantially the same as the height of the first and second photovoltaic cells and width that is less than the width of the first and second photovoltaic cells.

The rigid support structure can be a backer board.

The backer board can include alignment devices that are raised from the surface of the backer board.

The photovoltaic unit further can include an opaque removable label adhered to an outer surface of the cover.

The label can include a pre-printed label made of a degradable material that can be dissolved for removal.

The label can include a first indicator indicative of the location of the positive terminal and a second indicator indicative of the location of the negative terminal.

The photovoltaic unit can include a pass through wire adhered to a surface of the backer board opposite the PV cell.

The cover can be a polycarbonate cover and the cover includes a top surface and sidewalls extending approximately perpendicular to the top surface.

The photovoltaic unit can include a gasket configured to secure the photovoltaic unit within the depression in the masonry block.

The masonry block can be a concrete masonry unit.

The masonry block can be a cinder block.

The photovoltaic-clad masonry unit can be configured to be electrically connected to other photovoltaic-clad masonry units to form a photovoltaic array.

The electrical terminals can include conducting pins and clamping connectors configured to allow for variation in distance across a mortar joint from block to block, pass-through conductors within permitting through-wiring to allow for flexibility in wiring design and installation, and a cover protecting block-to-block connections.

In some additional aspects, a mold for manufacturing PV-clad concrete block can include a portion configured to generate a block shaped masonry unit and a device configured to form ridge on a surface of the masonry unit, the ridge forming a cavity in the masonry unit that is sized and positioned for installing a photovoltaic device and interconnections.

BRIEF DESCRIPTION OF THE DRAWINGS

FIG. 2A is a diagram of a masonry unit having a depression to receive a photovoltaic cell unit.

FIG. 2B is a diagram of the masonry unit of FIG. 2A after application of a bonding material.

FIG. 2C is a diagram of the masonry unit of FIG. 2A during application of the photovoltaic cell unit.

FIGS. 6A-6C show schematic diagrams of the connections to PV units at various stages of interconnection of multiple photovoltaic-clad masonry units.

DETAILED DESCRIPTION

In urban locations, where the roof space of buildings is insufficient for providing significant solar generation, sunlit areas of the facade provide an alternative. Solar technologies, such as the photovoltaic-clad masonry units described herein, designed specifically for structural facades in urban and remote areas that are vandal-resistant, theft resistant, and long-lived; that fill the need for these applications. The photovoltaic-clad masonry units described herein provide the building blocks to build a wall or other facade. There is also a need for solar technologies with these design characteristics to supply electricity to critical loads in unattended or remote locations.

Solar photovoltaic-clad masonry units such as photovoltaic-clad concrete blocks provide the building blocks to form a building, wall, facade, or other structure capable of producing power. The masonry units can be mortared in the traditional manner and the wiring of the photovoltaic cells can be completed afterward on the front, outward facing, sides of the blocks (e.g., on the side of the blocks that includes the photovoltaic cells). The photovoltaic-clad masonry units described herein provide the structural attributes of a masonry unit wall and the energy production of solar electric modules. The material of the masonry unit provides the structural support for the solar cells while also providing a thermal sink that mitigates high-temperature-based reductions to performance and reliability. The masonry unit also provides strength to allow the solar cells to be better protected from damage, and eliminates the need for expensive metal framework supports for the cells.

Figure 1:
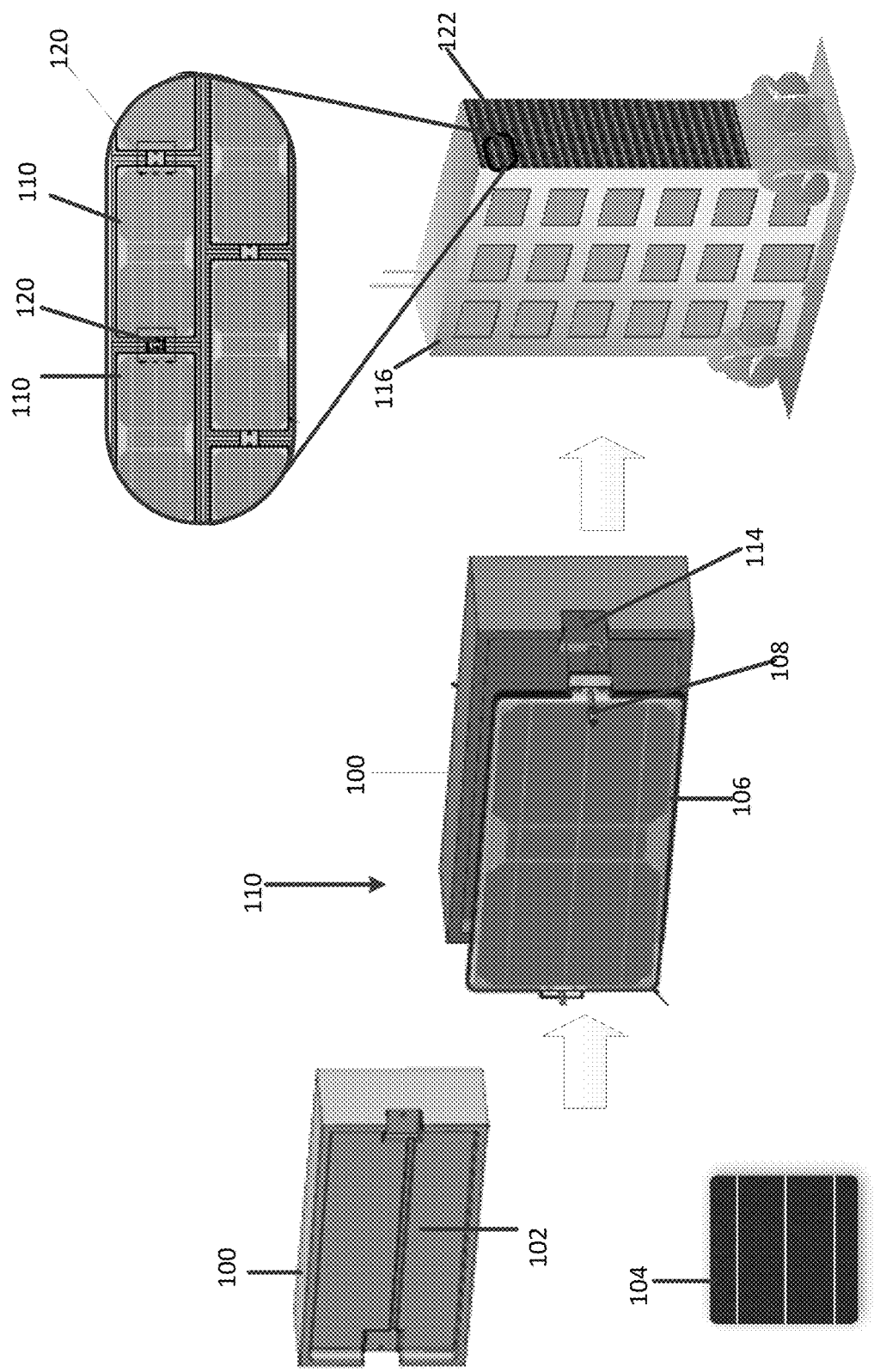
FIG. 1 is a schematic diagram of a process for integrating a photovoltaic-clad masonry unit into a building wall.

Referring to FIG. 1, a process for integrating PV-clad masonry units into a building 116 is shown. The process begins with a masonry unit 100 that includes a depression 102 for receiving a PV unit 106 that includes one or more PV cells 104. The depression 102 is sized to allow the PV unit 106 to fit within the recess and to allow connections between multiple PV units 106 to be formed in a connection region 114 on the front side of the masonry unit 100. Thus, a completed masonry unit 110 includes the masonry block 100 (e.g., a concrete block) and a PV unit 106 attached to the masonry block 100 via adhesive bonding agent and/or one or more screws 108.

Once integrated into a wall 122 of the building 116, the multiple PV clad masonry units 110 are interconnected via electrical wires or connections in the connection region 114 and a cover plate 120 or other protection device is placed over the electrical connections (see, e.g., FIGS. 6A-6C). As such, the electrical connections between adjacent PV clad masonry units 110 are formed on the front side (e.g., the side including the PV cells that forms the outward facing side of the structure). Because the connections are formed on the front side of the masonry unit, the masonry unit 100 can be formed using standard manual and automated molding processes.

Referring to FIGS. 2A-2C, a process for attaching a PV unit 208 with a masonry unit 200 to form a PV-clad masonry unit is shown. In FIG. 2A, the process begins by formation of a masonry unit 200 such as a concrete masonry unit (CMU). The masonry unit includes a unique cavity configured to receive a PV unit and to allow connections between the adjacent PV units to be formed on the front side of a wall after assembly and mortaring of the masonry units forming the wall.

The masonry unit, sometimes referred to as a concrete block, cinder block, or concrete masonry unit (CMU), is primarily used as a building material in the construction of walls and facades. A concrete block is a precast (e.g., blocks are formed and hardened before they are brought to the job site) concrete product used in construction. The concrete block or other masonry unit can include one or more hollow cavities, and their sides may be cast smooth or with a design. In the examples described herein, the front side of the masonry unit includes a depression to receive the PV cell as described herein.

In one example, the concrete used to make concrete blocks is a mixture of powdered Portland cement, water, sand, and gravel. In other examples, granulated coal or volcanic cinders can be used instead of sand and gravel (often referred to as a cinder block). Lightweight concrete blocks can be made by replacing the sand and gravel with expanded clay, shale, or slate.

The shapes and sizes of most common masonry blocks have been standardized to ensure uniform building construction. The most common block size in the United States is referred to as an 8-by-8-by-16 block, with the nominal measurements of 8 in (20.3 cm) high by 8 in (20.3 cm) deep by 16 in (40.6 cm) wide. This nominal measurement includes room for a bead of mortar, and the block itself actually measures 7.63 in (19.4 cm) high by 7.63 in (19.4 cm) deep by 15.63 in (38.8 cm) wide. In another example, reduced-depth block sizes of 8-by-4-by-16, with the nominal measurements of 8 in (20.3 cm) high by 4 in (10.1 cm) deep by 15.63 in (38.8 cm) wide are used for facades. In another example, "half-width" 4 in (10.1 cm) width block sizes of these examples are used to "fill-in" staggered-pattern installations in building designs.

Concrete blocks are often molded in high volume by large-scale automated production systems that mix, color, shape, cure, and package the blocks for distribution. One example is an automated manufacturing system where "shoes" are pressed onto blocks to form specified patterns and indentations. As described in more detail below, the molds depicted in FIGS. 3A and 3B are examples of patterns of such shoes for volume-production of blocks with indentations suited for accepting the photovoltaic units.

In one example of an automatic manufacturing system, the masonry unit 200 used to form the PV-clad masonry units described herein can be formed using a standard production process for producing concrete blocks which includes three basic processes: mixing, molding, and curing. First, the raw materials (e.g., the sand, grave, and cement) are mixed with water. Once the concrete is thoroughly mixed, it is forced into molds. The molds include an outer mold box containing several mold liners. The liners determine the outer shape of the block and the inner shape of the block cavities. After the molds are filled, the concrete is compacted by the upper mold head (also referred to as a shoe) pressing onto the mold cavities. The molded blocks are then cured in a kiln or other device.

Figure 3B:
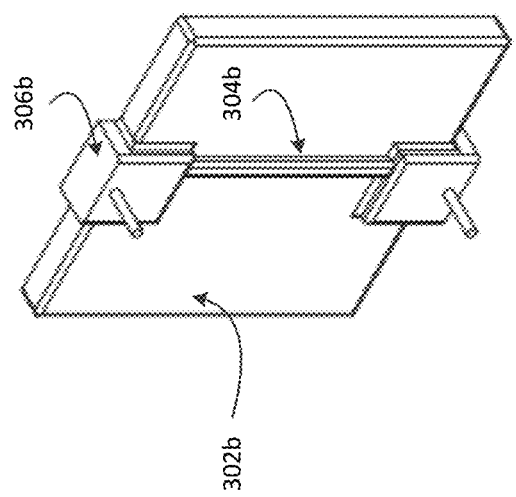
FIGS. 3A and 3B are diagrams of molds used to manufacture the masonry units, providing the indentations needed for the photovoltaic cell units.
Figure 3A:
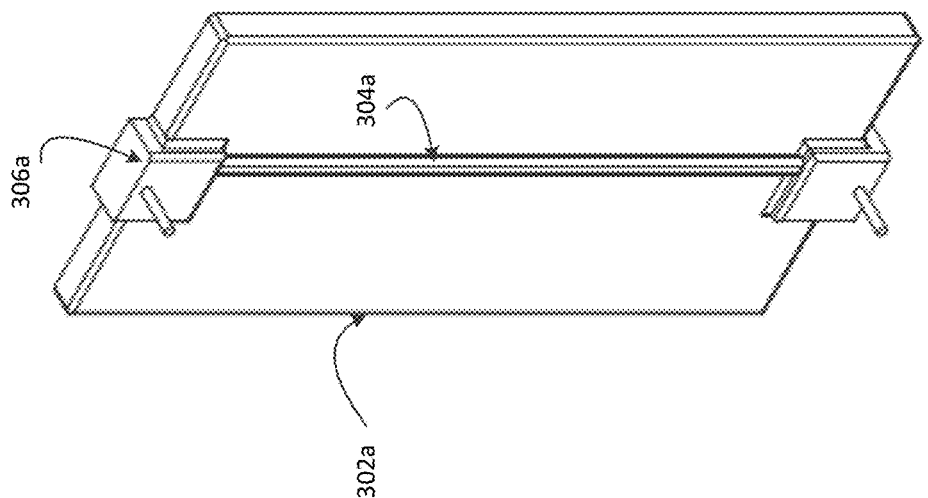

Example shoes for full and half brick masonry units with depressions sized and configured to receive the PV unit and to provide an area for wiring between the blocks are shown in FIGS. 3A and 3B, respectively. The completed masonry unit is thereby formed to exhibit a negative image of the shoe. Thus, the masonry unit will exhibit a depression (formed from areas 302a, 302b) sized to receive the PV unit with a raised area having a nominal width of 0.5 inches (1.27 cm) surrounding the depression in all areas other than the connection area. In some examples, the raised area configured to surround the PV unit is between about 0.25 and about 0.75 inches (e.g., between about 0.25 and about 0.75 inches, between about 0.4 and about 0.4 inches, or between about 0.45 and about 0.55 inches, about 0.5 inches). In general, the depression is between 0.5 and 0.75 inches (e.g., 0.625 inches) in depth. The depression formed by areas 302a, 302b includes a portion that is recessed to a greater depth and sized to receive a wire of the PV unit (formed from areas 304a, 304b). The masonry unit will exhibit a depression that extends to the edge of the masonry unit formed from areas 306a, 306b. These areas allow for wiring to extend between the adjacent blocks.

Referring back to FIGS. 2A-2C, as shown in FIG. 2B, after the masonry block has been manufactured, a "thin set" adhesive 206 (e.g., an adhesive mortar made of cement, fine sand and a water retaining agent such as an alkyl derivative of cellulose) or other adhesive used to attach items to surfaces such as cement or concrete is applied in the depression 202. After application of the thinset adhesive 206, a PV unit 208 is placed within the depression 202. The PV unit includes a gasket 210 or liquid to seal the voids between the edge of the depression in the masonry unit and the PV unit 208.

Two screws 212 are provided at each end of the PV unit 208 to mechanically secure the PV unit 208 to the masonry unit 200. Thus, the PV unit 208 is secured to the masonry unit 200 within depression 202 by the thin set material 206, the gasket 210, and the screws 212. Having multiple independent mechanisms configured to secure the PV unit 208 to the masonry unit 200 helps to ensure that the PV unit 208 will not separate from the masonry unit 200. After application of the PV unit 208 to the masonry unit 200, the top of the PV unit 208 is substantially planar with the tops of the edges of the masonry unit.

FIGS. 4A, 4B, 4C, and 4D are expanded, back, cross-sectional, and front views of a PV unit 400. In general, the PV unit 400 is formed of multiple layers including a pass-through wire 402, a backer board 404, an elastomer encapsulant (e.g., polydimethylsiloxane Sylgard 184 manufactured by Dow Corning) not-shown, PV cells 406, the same elastomer encapsulant not-shown, a UV and abrasion resistant cover 410, and a gasket 412, each of which is discussed in further detail below.

In general, once assembled, the elastomer encapsulant encases the various internal PV cells and the UV and abrasion resistant cover 410 surrounds the encapsulant forming a weather resistant assembly. All other voids between the abrasion resistant cover 410 and the backer board 404 are also filled with the elastomer encapsulant.

The backer board 404 forms the rear surface of the PV unit 400. The backer board 404 provides various functionality to the PV unit 400 including leveling the rough surface of the masonry unit below the PV cells 406. Providing a level surface below the PV cells 406 helps to prevent fracturing of the fragile PV cells 406, for example fracturing which could happen upon application of pressure to the top of PV unit 400. The backer board 404 also provides a surface to which other layers of the PV unit are adhered to form an enclosed unit that is resistant to moisture, oxygen, or other contaminants that may damage the PV cells 406. Finally, the backer board 404 can also serve as a thermal sink to help transfer heat and potentially reduce high operating temperature of the PV cells 406 that may reduce their performance and longevity.

The backer board 404 can be formed of various materials including cement board, which is a combination of cement and reinforcing fibers. When used, cement board adds impact resistance and strength to the PV unit 400. In some examples, the backer board 404 can be made from a Portland cement based core with glass fiber mat reinforcing at both faces The backer board 404 includes alignment pins 420 that are raised from the surface of the backer board 404. The alignment pins 420 are used to position and hold the PV cells 406 at appropriate locations on the PV facing side of the backer board 404. The alignment pins 420 have a height calibrated to space the abrasion resistant cover 410 apart from the PV cells 406. In some examples, the pins have a height of about between about ⅛ inch and ⅓ inch, for example ¼ inch. The length of these pins forms a defined thickness between the PV cells 406 and the abrasion cover 410. The alignment pins 420 contact the UV and abrasion resistant cover 410 such that forces applied to cover 410 are predominately transferred to the backer board 404 rather than through the PV cells 406. Transferring of forces from cover 410 (e.g., from the surface of the PV unit) to the backer board 404 can prevent damage to the relatively fragile PV cells 406.

Figure 4A:
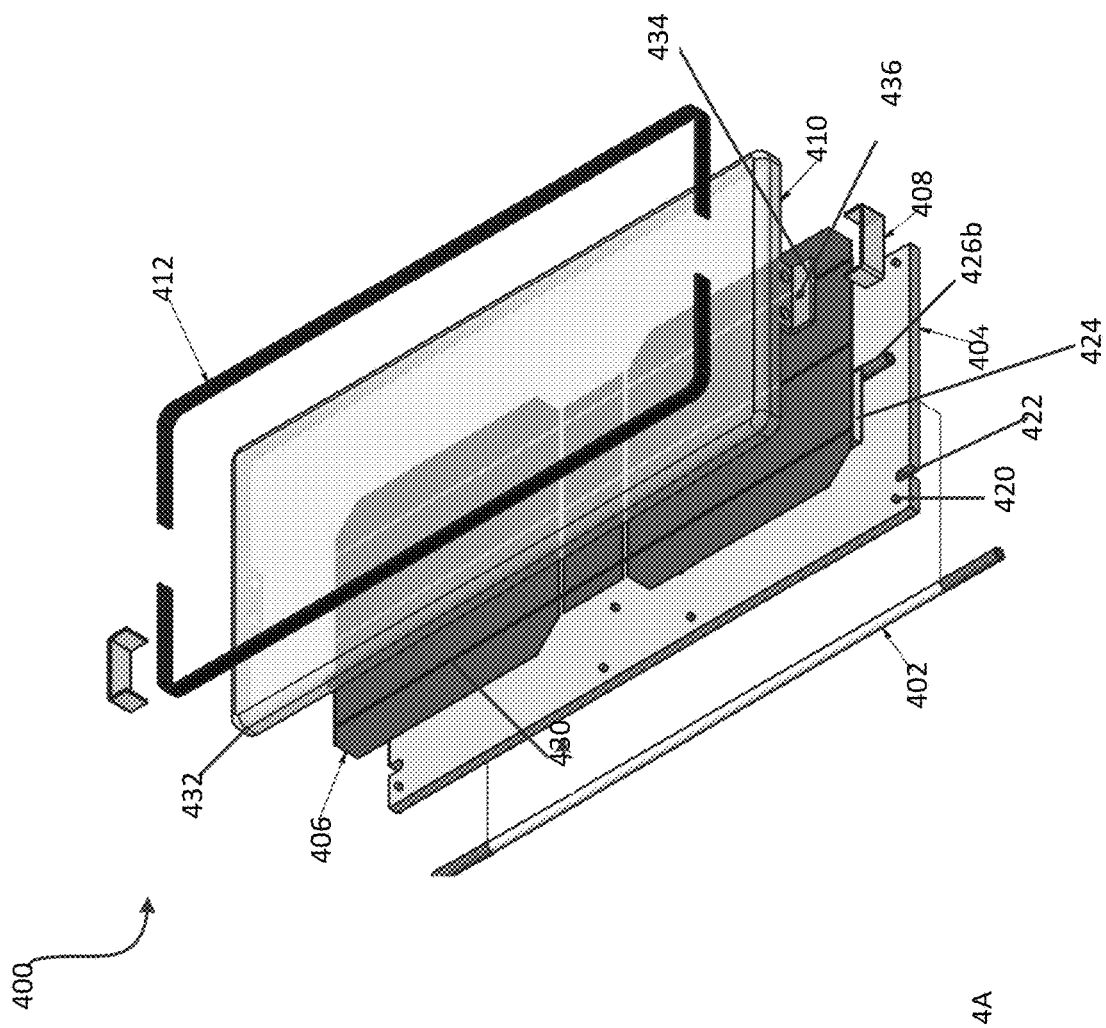
FIG. 4A is an expanded view of multiple components of a photovoltaic cell unit.
Figure 4B:
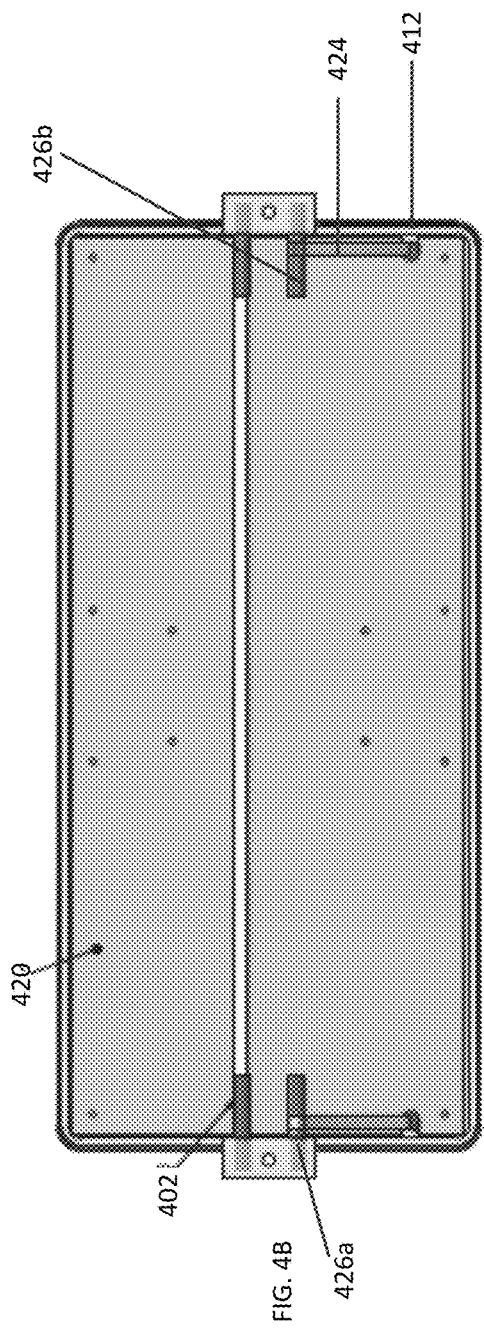
FIG. 4B is back view of the photovoltaic cell unit of FIG. 4A.
Figure 4C:
FIG. 4C is a cross-sectional side-view of the photovoltaic cell unit of FIG. 4A.
Figure 4D:
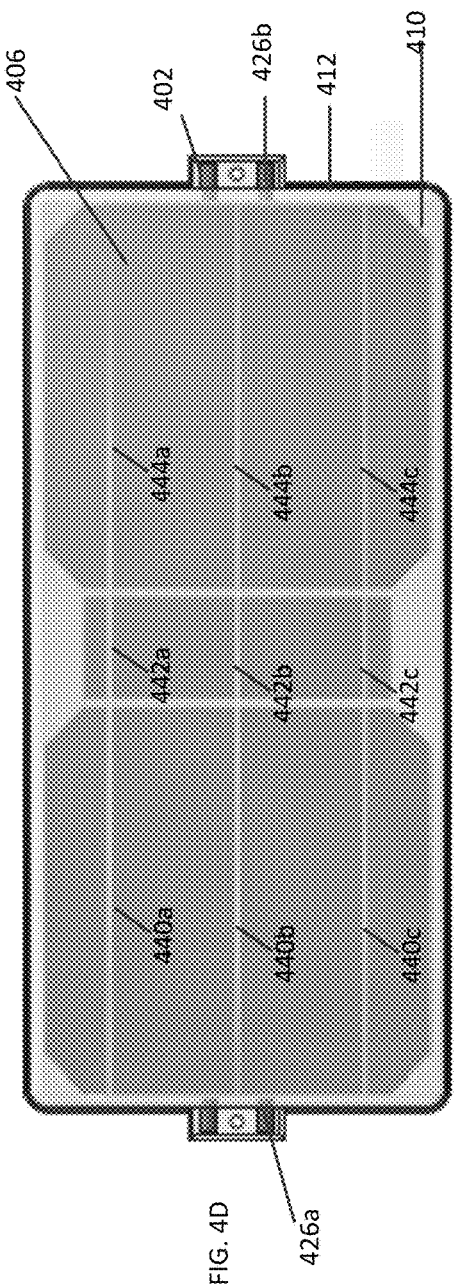
FIG. 4D is a front view of the photovoltaic cell unit of FIG. 4A.

The backer board 404 also includes a wire pass region 422. The wire pass region 422 provides a location for wiring from the PV cells 406 to be routed from the PV cells 406 to the backside of the backer board 404. More particularly, a flexible buss-wire connection 424 attached to the PV cells 406 and to the negative and positive copper connecting pins 426a and 426b for the PV unit is wrapped around the backer board 404 such that the pins 426a and 426b are located on the backside of the backer board 404 as shown in FIG. 4B. Routing the buss-wire 424 for the PV cells to the backside of the backer board 404 allows the PV cells 406 to lie flat against the backer board 404.

A pass-through wire 402 that includes copper connecting pins on each end of the pass-through wire 402 is also located on the backside of backer board 404. In some examples, the pass-through wire 402 may be secured to the backside of the backer board using epoxy. A pass-through wire 402 is configured to pass energy through the block, but is not connected to the PV cells of the particular panel. The pass-through wire 402 serves as a return for a set of connected blocks to enable electrical design flexibility in individual applications. As such, both the individual wiring for the cell and the pass-through wiring 402 are placed on the backside of the backer board 404.

As noted above, the PV cells 406 are situated on the front side of the backer board 404. The PV cells are aligned with the backer board 404 using the alignment pins 420. In this particular example, a set of three PV cells is included in the PV unit 400. Two of the cells are generally square in shape with the corners of the square cut off at an angle (mitred). A third PV cell is arranged between these two PV cells. The third (center) PV cell is rectangular in shape and has a width that is substantially the same as twice the width of the surrounding edge of the masonry unit and the width of the mortar joint between two masonry units. Thus, the third PV cell is substantially smaller in width than the two primary PV cells.

Figure 5:
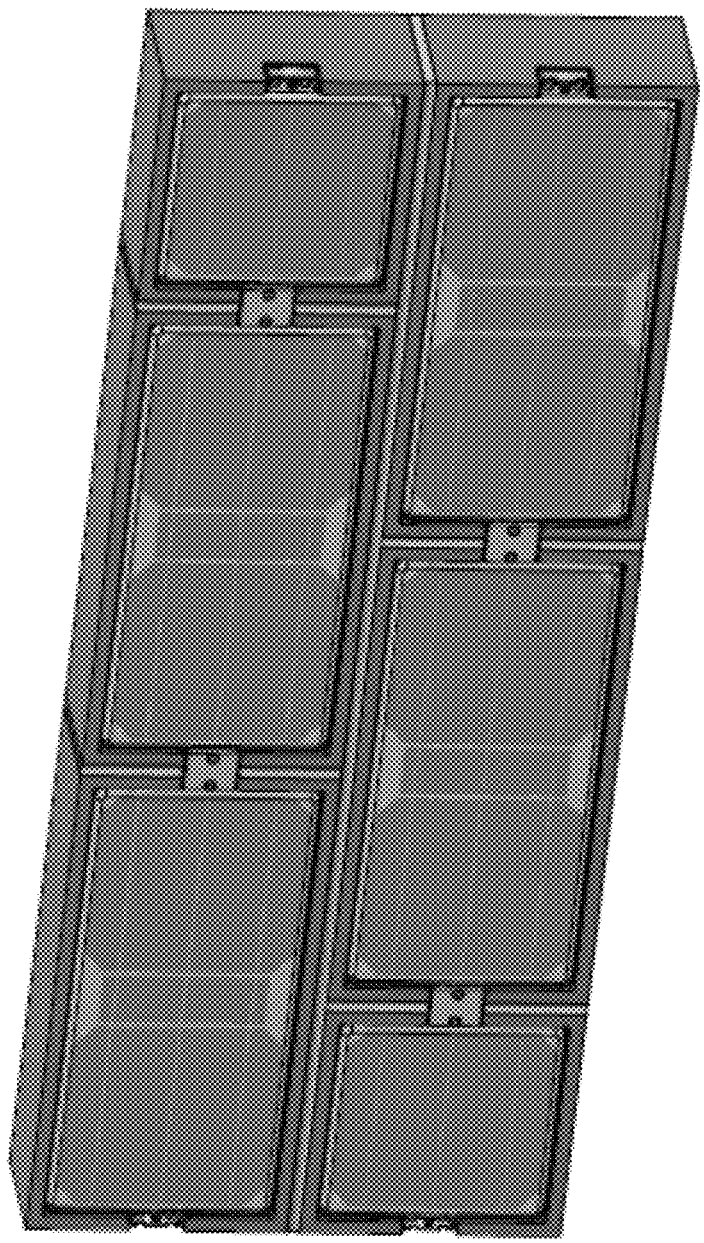
FIG. 5 is a diagram of full-size blocks installed in a multiple unit array.

Inclusion of the third PV cell can provide multiple advantages. First, the third PV cell can increase the electrical output of the PV unit. Additionally, the shape of the third PV cell allows the horizontal and vertical locations of the photovoltaic cells on full-sized masonry units to match the horizontal and vertical locations of neighboring masonry units in wall systems (as shown in FIG. 5) Another example is a half-sized masonry constructed with only a single PV cell. The single PV cell of the half sized masonry units will align vertically with the similarly shaped PV cells of full-size blocks above and below the half sized masonry unit when arranged to form a wall. The first and third PV cells are traditional full-sized monocrystalline silicon 156 mm×156 mm (6 inch×6-inch) nominal sized cells. The center cell is sized to fit in the remaining gap between these cells, depending on the size of the concrete masonry unit. The half-size CMU, nominally 8-inches by 8-inches in frontal area, uses only one (1) full-sized monocrystalline silicon 156 mm×156 mm (6 inch×6-inch) nominal sized cell.

In general, the PV cells 406 are electrical devices that convert the energy of light directly into electricity by the photovoltaic effect. The PV cells can be made of various materials including crystalline silicon or polycrystalline silicon. In additional examples, the PV cells can be made from materials such as cadmium Telluride, copper indium gallium selenide, gallium arsenide, or indium gallium nitride. The solar cell can include an anti-reflection coating to increase the amount of light coupled into the solar cell. Exemplary anti-reflection coatings include Silicon Nitride and titanium dioxide. The PV cells 406 include a full area metal contact made on the back surface (e.g., the surface nearest to the backer board 404).

In this example, the three PV cells (left, middle, right) are electrically connected in series to create an electrically polarized electrical assembly, negative (−) on one side of the block and positive on the other side of the block. Starting from the negative terminal pin 426a, the electrical pathway is negative pin 426a, connected to negative bus wire, connected to tab wires 440a, 440b, and 440c soldered to the face of the first cell. Tab wires connected to the base (e.g., backside) of the first cell are connected to tab wires 442a, 442b, and 442c soldered to the face of the second cell. Tab wires connected to the base of the second cell (not shown) are connected to tab wires 444a, 444b, and 444c soldered to the face of the third cell. Tab wires connected to the base of the third cell are connected to a positive bus, which is connected to positive pin 426b.

The top surface of the PV unit 400 is made of a UV and abrasion resistant cover 410. For example, cover 410 can be made of a polycarbonate material. The use of a polycarbonate material rather than glass provides various advantages. For example, polycarbonate is less likely to shatter or break. UV protective additives and coatings provide long-life in sunny conditions. Additionally, the cost to manufacture a polycarbonate layer can be less than the cost to manufacture a glass layer because the polycarbonate layer can be made using an injection molding process.

The void between the top of the solar cells 406 and the cover 410 can be filled with and elastomer such as a polydimethylsiloxane (e.g., Sylgard 184 manufactured by Dow Corning). In general, cover 410 rests on the alignment dowels or pegs 420 of the backer board 404. Cover 410 includes a rounded lip 432 that extends downwardly from the top surface of the device. The rounded lip extends to meet the edge of the backer board 404 to form an enclosed water and oxygen resistant PV unit 400. Cover 410 also includes a molded extension tab 434, which includes a screw hole 436 to attach the PV unit 400 to the masonry unit (e.g., using screw 108 as shown in FIG. 1).

The PV unit 400 also includes a gasket 412. The gasket 412 ensures that the PV unit fits snugly within the depression and the masonry unit (e.g., depression 202 and FIG. 2C). In general, the gasket 412 provides a mechanical seal that fills the space between the mating surfaces (e.g., between the PV unit and the masonry unit) and prevents air, water, or other contaminants from entering into the PV unit 400. The gasket 412 can be made from various materials such as the various forms of rubber or silicone.

Referring back to FIG. 1, after the PV units have been assembled and have been joined to the masonry unit 100, the masonry units with the PV units are then ready to be assembled to form a wall. More particularly, the masonry units are stacked and joined by mortar and according to typical masonry unit laying process. After the masonry units have been assembled to form a wall, the PV units of the various blocks must be connected. The connections between the PV units are formed on a front facing or outside surface of the wall. As such, it is not necessary to provide access to the backside of the wall in order to complete or repair the electrical connections.

FIGS. 6A-6C show a process for electrically connecting the PV cells of adjacent masonry units. FIG. 6A shows the joint between two adjacent masonry units (e.g., a first masonry unit including the PV cell 602a, the gasket 604a, and the edge of the masonry unit 606a and the second masonry unit including the PV cell 602b, the gasket 604b, and the edge of the masonry unit 606b). The blocks are joined by a mortar joint 608. Copper connecting pins 610a, 610b extend from the first and second masonry units, respectively, forming connections to the pass-through wire for each block. Copper connecting pins 612a, 612b extend from the first and second masonry units, respectively, forming connections to the PV cells for each block.

As shown in FIG. 6B, the copper connecting pins for the pass-through wires (e.g., pins 610a, 610b) are joined using an electrically conductive clamp-on fitting 618. The clamp-on fitting forms an electrical contact to each of the copper connecting pins 610a, 610b, thereby electrically connecting the pass-through wire of the first masonry unit to the pass-through wire of the second masonry unit. Use of a clamp-on fitting is believed to provide various advantages. For example, because the clamp-on fitting can form an electrical connection to any portion of the copper connecting pin extending from the masonry unit, the spacing between the masonry units across the mortar joint can vary without causing issues in connection of the adjacent PV cells. The copper connecting pins for adjacent PV cells (e.g., pins 612a, 612b) are joined in a similar fashion using a clamp-on fitting 620.

As shown in FIG. 6C, after the two sets of connecting pins are joined using the clamp-on fittings 618 and 620, a cover is secured over the electrical connections. The cover provides a watertight seal over the connections. The cover 624 is secured to the masonry units using two screws 626a and 626b, which screw into couplings threaded onto studs 614a and 614b, which are also used to secure the PV unit to the block. After connections are complete, but before the top cover is installed, the entire cavity can be filled with sealant.

Figure 7A:
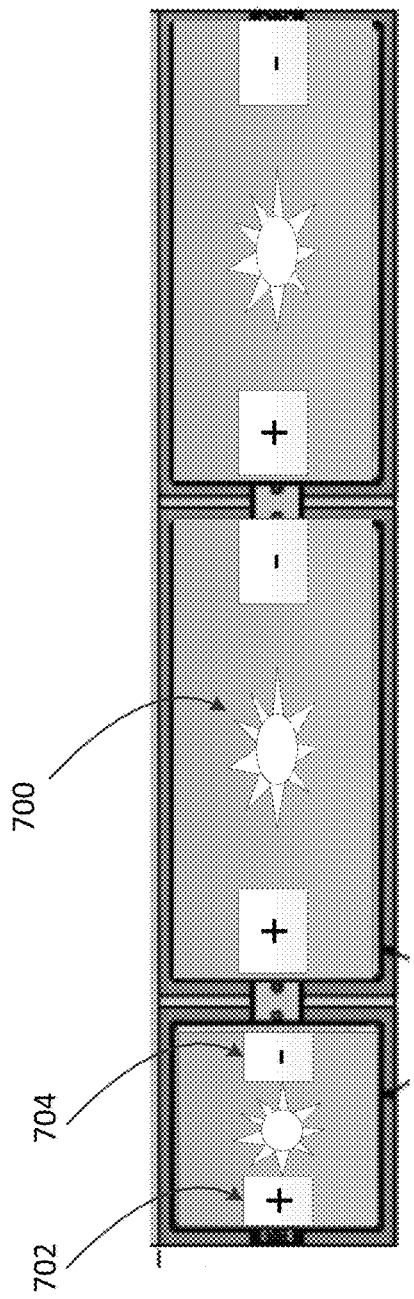
FIGS. 7A and 7B show a set of photovoltaic cell units before and after removal of an opaque coating on the photovoltaic cell unit.
Figure 7B:
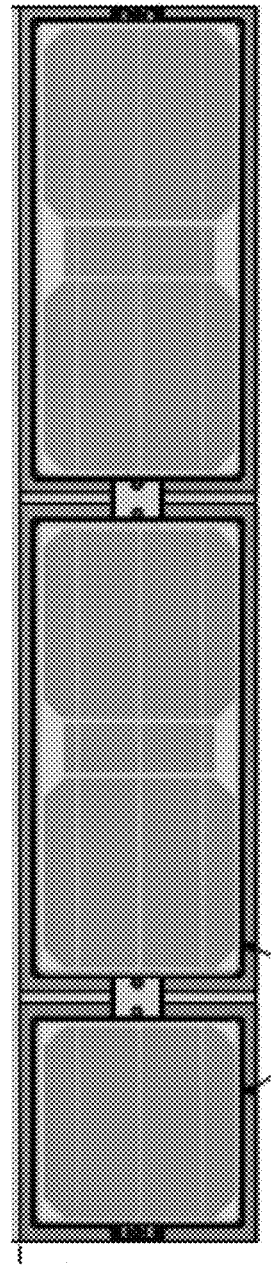

In some examples, as shown in FIG. 7A, the PV units can be initially covered with labels or other degradable surface material 700 that prevents light from reaching the PV cells prior to removal of the material. For example, the surface of the PV unit in the masonry unit can be coated with a label that prevents activation of the PV cells by blocking light from being transmitted through the label (e.g., the label is substantially opaque). By blocking the light from activating the PV cells, blocks can be electrically connected to one another without current being present in the wiring (e.g., the cells are not "live"). This simplifies the task of making electrical connections between the blocks because the electrician does not have to work with live wires (e.g., wires carrying an electrical current) while forming the connections. Additionally, the label can protect the surface of the PV unit from being scratched by other masonry units during transportation and construction (e.g., while the masonry units are on and removed from the pallet). After removal of the label, as shown in FIG. 7B, the surface of the PV cell is able to receive light and generate power.

In some examples, the label on the surface of the PV unit can be formed from a soluble material that can be removed using water or a masonry cleaning solution. Examples of such biodegradable materials that can be used as a cover include starch-based products, which can be preprinted and applied to the surface of the PV unit as a label.

In some additional examples, the label on the PV unit can include an indication of a positive and negative terminal (e.g., indications 702, 704) for the PV unit. Providing an indication of the positive/negative terminals can aid in laying the blocks because it will provide a visual indication of the correct orientation of the block. In some additional examples, the portion of the label on the positive side of the block can be a different color from the portion of the label on the negative side of the block. As such, once the blocks are assembled it will be visually apparent based on the pattern of the labels when a block is not placed in the planned orientation.

Solar energy generating wall systems are built up from individual blocks (e.g., the blocks 110 shown in FIG. 1), connected in series and parallel to form arrays that supply current and voltage specific to customer loads. In some examples, such wall systems may be connected to battery charging systems (see FIG. 8A). In other examples, such wall systems may be connected to power conversion devices, including inverters that convert the direct-current electrical output of the wall systems to alternating current suitable for interconnection to utility electrical systems (see FIG. 8B).

Figure 8A:
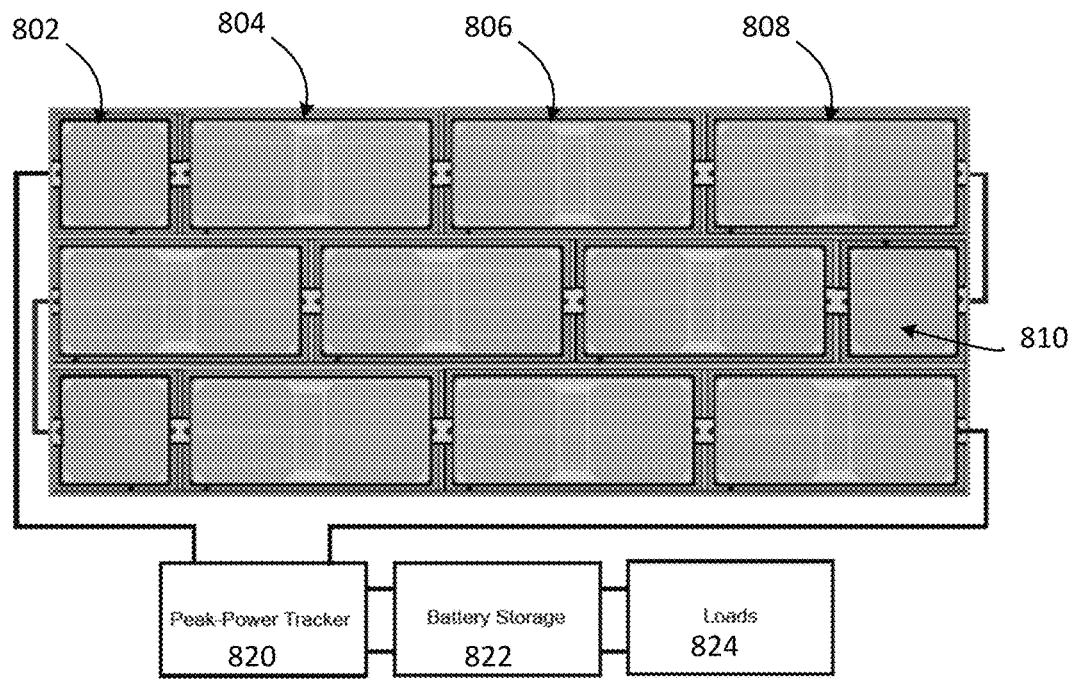
FIGS. 8A and 8B show arrays of photovoltaic cells.
Figure 9:
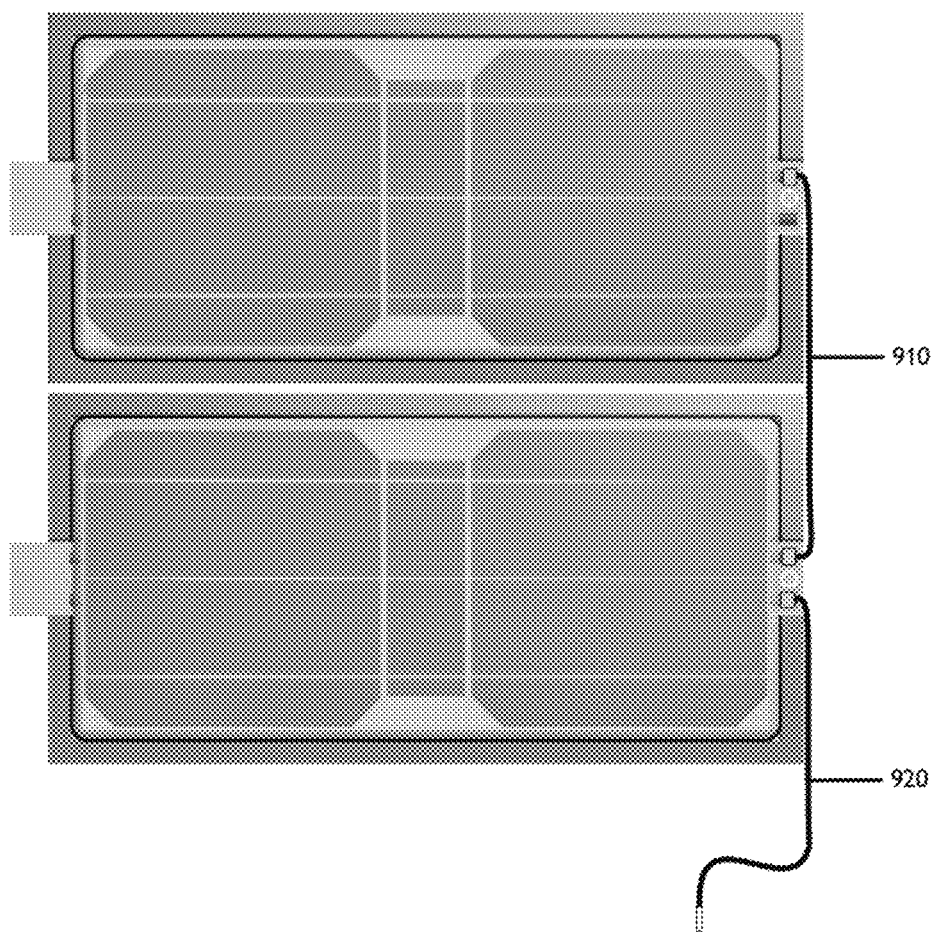
FIG. 9 shows a blocks with a clamp-on jumper and clamp-on-connector.

In the example wall system of FIG. 8A, each block is connected horizontally in series to a neighboring block by clamp-on connectors (620 in FIG. 6B), and otherwise using clamp-on jumper (910 in FIG. 9). The example wall system is then connected to a battery bank by clamp-on cable (920 in FIG. 9) at the negative terminal and by another clamp-on cable 920 at the positive terminal to form a charging circuit. A customer load is also connected to the same circuit. Connections between rows of blocks and between blocks and customer electrical systems are made by these connectors.

In the example of an array of blocks, the positive terminal of the first block 802 in the array is connected to the positive input of a peak power tracker 820. The blocks in each row of the array are connected in series such that the positive terminal of one block is connected to the negative terminal of the adjacent block. For example, the negative terminal of block 802 is connected to the positive terminal of block 804, the negative terminal of block 804 is connected to the positive terminal of block 806, the negative terminal of block 806 is connected to the positive terminal of block 808. For blocks situated at the end of a row in the array, a parallel connection is formed between the rows of blocks. For example, the negative terminal of block 808 is connected to the negative terminal of block 810. The negative terminal of the final block in the array is connected to the negative input of the peak power tracker 820. In general, the peak power tracker 820 is a device that increases the efficiency of battery charging by a solar cell by operating at or near a maximum power point. The peak power tracker 820 can be, for example, a power conditioner or DC-DC converter that is introduced between the solar PV array and the battery 822. This converter adapts the load to the array so that maximum power is transformed from the array. In some examples, a duty cycle, D, of this converter can be changed till the peak power point is obtained. The power stored in battery 822 can then be used to power loads 824.

Figure 8B:
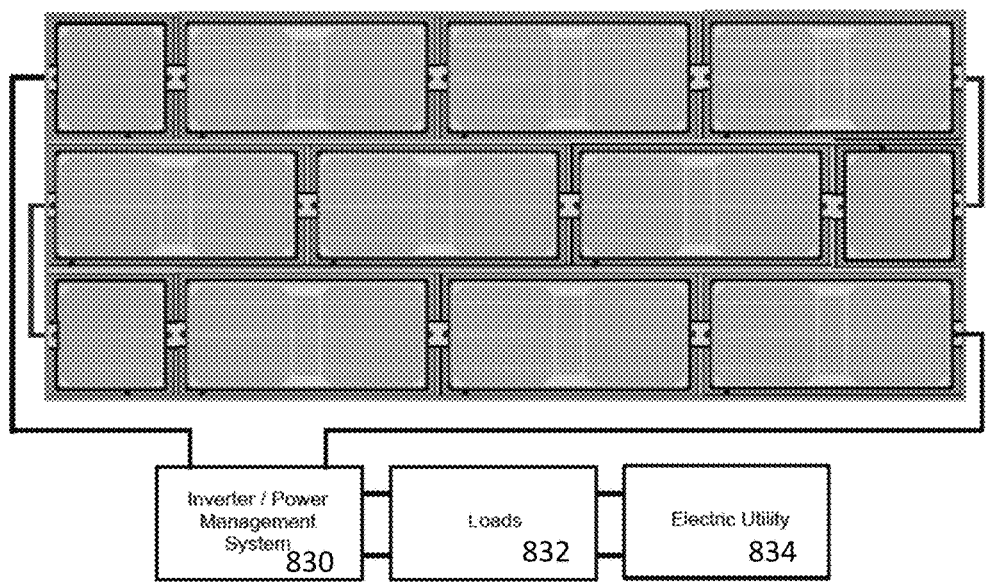

In the example wall system of FIG. 8B, each block is connected horizontally in series to a neighboring block by clamp-on connectors (620 in FIG. 6B), and vertically using clamp-on jumper (910 in FIG. 9). The blocks in the array can be connected in series and parallel as described above in relation to FIG. 8A. The example wall system is then connected to an inverter by clamp-on cables 920 from the negative and positive connections of the wall systems. The solar inverter 830 converts the variable DC output of the photovoltaic (PV) array into a clean sinusoidal 50- or 60 Hz AC current that can be applied directly to loads 832 and/or to the commercial electrical grid 834 or to a local, off-grid electrical network.

Clamp-on jumper 910 is a direct-bury wire with clamp-on connectors affixed to each end. Clamp-on cable 920 is a direct-bury wire with clamp-on connectors affixed to one end. The other end is bare for connection with customer specified equipment or connectors. In some cases the wire is specifically suitable for direct-bury in concrete. In some cases, the wire is run through conduit piping.

While in the examples described above, the PV unit was disposed in a masonry unit, in some examples other building materials could be used.

For example, the PV unit could be disposed in a wood based block or wall shingle. In one particular example, a clap-board wood shingle could include a depression sized to receive the PV unit. The PV units of adjacent shingles could be connected using wiring schemes and devices similar to those described above. In another particular example, a log such as the logs used to build log cabins or retaining walls could include one or multiple depressions sized to receive the PV unit(s). The adjacent PV units in the logs could be connected using wiring schemes and devices similar to those described above.

In another example, the PV unit could be included in a manufactured siding unit such as a composite building material. One exemplary composite building material are structural insulated panels (SIPs). SIPS include an insulating layer of rigid core sandwiched between two layers of structural board such as sheet metal, plywood, cement, magnesium oxide board (MgO) or oriented strand board (OSB) and the core either expanded polystyrene foam (EPS), extruded polystyrene foam (XPS), polyisocyanurate foam, polyurethane foam or composite honeycomb (HSC). The SIPS units can include a depression sized to receive a PV unit (or multiple PV units) and adjacent units can be connected using wiring schemes and devices similar to those described above.

In general, the systems, devices, and methods described herein can be applied to any type of building or wall construction material where the electrical connections between adjacent units are formed on the front side (e.g., the side including the PV cells that forms the outward facing side of the structure).

What is claimed is:

1. A photovoltaic-clad masonry unit comprising:
    a photovoltaic unit including:
        a rigid support structure with a back surface and comprising a backer board;
        one or more photovoltaic cells supported by the rigid support structure; and
        a cover disposed above the one or more photovoltaic cells and configured to be secured to the rigid support structure to provide a water resistant enclosure that encloses the one or more photovoltaic cells; and
        a pass through wire adhered to a surface of the backer board opposite the one or more photovoltaic cells, the pass through wire electrically isolated from the one or more photovoltaic cells;
    a masonry unit including a depression defined by an outer surface extending between a raised area on an outward facing side of the masonry unit, the photovoltaic unit being secured within the depression with the back surface of the rigid support structure attached to the outer surface of the masonry unit;
    a positive terminal extending from the photovoltaic unit and electrically connected to the one or more photovoltaic cells; and
    a negative terminal extending from the photovoltaic unit and electrically connected to the one or more photovoltaic cells.

2. The photovoltaic unit of claim 1, wherein the photovoltaic unit is configured such that connections between adjacent photovoltaic units are provided on an outward facing side of the photovoltaic units.

3. The photovoltaic unit of claim 2, further comprising an adhesive layer configured to secure the photovoltaic unit within the depression.

4. The photovoltaic unit of claim 1, wherein the one or more photovoltaic cells comprise:
    a first photovoltaic cell having a shape that is substantially square with mitred corners;
    a second photovoltaic cell having a shape that is substantially square with mitred corners; and
    a third photovoltaic cell having a shape that is substantially rectangular, the third photovoltaic cell arranged between the first and second photovoltaic cells and having a height that is substantially the same as a height of the first and second photovoltaic cells and a width that is less than a width of the first and second photovoltaic cells.

5. The photovoltaic unit of claim 1, wherein the backer board includes alignment devices that are raised from the surface of the backer board.

6. The photovoltaic unit of claim 1, wherein the photovoltaic unit further comprises an opaque removable label adhered to an outer surface of the cover.

7. The photovoltaic unit of claim 6, wherein the label comprises a pre-printed label made of a dissolvable material.

8. The photovoltaic unit of claim 6, wherein the label includes a first indicator indicative of the location of the positive terminal and a second indicator indicative of the location of the negative terminal.

9. The photovoltaic unit of claim 1, wherein the cover comprises a polycarbonate cover and the cover includes a top surface and sidewalls extending approximately perpendicular to the top surface.

10. The photovoltaic unit of claim 2, wherein the photovoltaic unit further comprises a gasket configured to secure the photovoltaic unit within the depression in the masonry unit.

11. The photovoltaic unit of claim 10, wherein the masonry unit comprises a cinder block.

12. The photovoltaic unit of claim 1, wherein the photovoltaic unit is configured to be electrically connected to other photovoltaic units to form a photovoltaic array.

13. The photovoltaic units of claim 1, wherein the positive and negative terminals comprise:
    conducting pins and clamping connectors configured to allow for variation in distance across a mortar joint from unit to unit;
    pass-through conductors within, permitting through-wiring to allow for flexibility in wiring design and installation; and
    a cover protecting unit-to-unit connections.

14. The photovoltaic unit of claim 2, wherein the pass through wire is adapted to extend parallel to the outward facing side of the masonry unit with the depression.

* * * * *

UNITED STATES PATENT AND TRADEMARK OFFICE
CERTIFICATE OF CORRECTION

PATENT NO. : 9,590,557 B2
APPLICATION NO. : 14/737796
DATED : March 7, 2017
INVENTOR(S) : Patrick John Adrian Quinlan, Jonathan Richard Lewis and Jason Michael Laverty It is certified that error appears in the above-identified patent and that said Letters Patent is hereby corrected as shown below:

In the Claims

Column 12, Line 49, Claim 13, delete "units" and insert --unit--.

Signed and Sealed this
Second Day of May, 2017

Michelle K. Lee
*Director of the United States Patent and Trademark Office*